(12) United States Patent
Huang

(10) Patent No.: US 12,557,709 B2
(45) Date of Patent: *Feb. 17, 2026

(54) PACKAGE STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/955,239

(22) Filed: Sep. 28, 2022

(65) Prior Publication Data

US 2023/0016985 A1     Jan. 19, 2023

Related U.S. Application Data

(63) Continuation of application No. 16/862,453, filed on Apr. 29, 2020, now Pat. No. 11,488,901.

(51) Int. Cl.
*H01L 23/498* (2006.01)
*H01L 21/48* (2006.01)
(Continued)

(52) U.S. Cl.
CPC .... *H01L 23/49833* (2013.01); *H01L 21/4857* (2013.01); *H01L 23/49811* (2013.01);
(Continued)

(58) Field of Classification Search
CPC ............. H01L 23/5385; H01L 23/5386; H01L 23/5383
See application file for complete search history.

(56) References Cited

U.S. PATENT DOCUMENTS

| | | | | |
|---|---|---|---|---|
| 11,488,901 B2 * | 11/2022 | Huang | ................. | H01L 23/5386 |
| 2005/0218528 A1 * | 10/2005 | Beatty | ..................... | H01L 24/28 |
| | | | | 257/E21.503 |

(Continued)

FOREIGN PATENT DOCUMENTS

CN         102034768 A  *  4/2011   ....... H01L 23/49816

OTHER PUBLICATIONS

Final Office Action for U.S. Appl. No. 16/862,453, issued Apr. 15, 2022, 9 pages.

(Continued)

*Primary Examiner* — Michele Fan
(74) *Attorney, Agent, or Firm* — Foley & Lardner LLP

(57) ABSTRACT

A package structure and a method for manufacturing a package structure are provided. The package structure includes a substrate, at least one redistribution structure, at least one electronic component and at least one semiconductor die. The substrate has a first surface and a second surface opposite to the first surface. The at least one redistribution structure is disposed on the first surface of the substrate. The at least one electronic component is disposed on the first surface of the substrate. The at least one semiconductor die is disposed on the at least one redistribution structure and electrically connected to the at least one electronic component through the substrate.

16 Claims, 12 Drawing Sheets

(51) Int. Cl.
  *H01L 23/00* (2006.01)
  *H01L 23/538* (2006.01)
  *H01L 25/16* (2023.01)
(52) U.S. Cl.
  CPC .... *H01L 23/49838* (2013.01); *H01L 23/5385* (2013.01); *H01L 23/5386* (2013.01); *H01L 24/16* (2013.01); *H01L 25/16* (2013.01); *H01L 2224/16227* (2013.01); *H01L 2924/19105* (2013.01)

(56) References Cited

U.S. PATENT DOCUMENTS

| | | | |
|---|---|---|---|
| 2007/0266886 A1* | 11/2007 | En | H05K 3/427 106/1.18 |
| 2009/0145636 A1 | 6/2009 | Miki et al. | |
| 2012/0068322 A1* | 3/2012 | Hanabe | H01L 23/50 257/676 |
| 2013/0200512 A1 | 8/2013 | Wu | |
| 2013/0277838 A1* | 10/2013 | Yu | H01L 24/02 257/737 |
| 2015/0318263 A1* | 11/2015 | Yu | H01L 25/0657 438/109 |
| 2017/0033080 A1* | 2/2017 | Chen | H01L 25/0657 |
| 2019/0131273 A1 | 5/2019 | Chen et al. | |
| 2019/0311999 A1 | 10/2019 | Kim et al. | |
| 2020/0381362 A1* | 12/2020 | Tseng | H01L 21/6835 |
| 2021/0193581 A1* | 6/2021 | Seo | H01L 23/5384 |
| 2021/0210414 A1 | 7/2021 | Kang et al. | |

OTHER PUBLICATIONS

Non-Final Office Action for U.S. Appl. No. 16/862,453, issued Oct. 29, 2021, 12 pages.
Notice of Allowance for U.S. Appl. No. 16/862,453, issued Jul. 1, 2022, 6 pages.

* cited by examiner

PACKAGE STRUCTURE AND METHOD FOR MANUFACTURING THE SAME

CROSS-REFERENCE TO RELATED APPLICATION

This application is a continuation of U.S. patent application Ser. No. 16/862,453 filed Apr. 29, 2020, the contents of which is incorporated herein by reference in its entirety.

BACKGROUND

1. Field of the Disclosure

The present disclosure relates to a package structure and a manufacturing method, and to a package structure including at least one semiconductor die electrically connected to at least one electronic component through a substrate, and a method for manufacturing the package structure.

2. Description of the Related Art

A semiconductor package structure may include an active semiconductor die and electronic components (e.g., passive components). The electrical connection path from the active semiconductor die to the electronic components may be long, which may result in greater signal loss. The longer electrical connection path may adversely affect the electrical properties of the semiconductor package structure. To reduce the signal loss, the electrical connection path should be shortened.

SUMMARY

In some embodiments, a package structure includes a substrate, at least one redistribution structure, at least one electronic component and at least one semiconductor die. The substrate has a first surface and a second surface opposite to the first surface. The at least one redistribution structure is disposed on the first surface of the substrate. The at least one electronic component is disposed on the first surface of the substrate. The at least one semiconductor die is disposed on the at least one redistribution structure and electrically connected to the at least one electronic component through the substrate.

In some embodiments, a package structure includes a substrate, a redistribution structure, and a plurality of electronic components. The substrate has a first surface and a second surface opposite to the first surface. The redistribution structure is disposed on the first surface of the substrate. An area of the redistribution structure is smaller than an area of the substrate from a top view. The plurality of electronic components are disposed on the first surface of the substrate and electrically connected to the substrate.

In some embodiments, a method for manufacturing a package structure includes: (a) providing a substrate having a first surface and a second surface opposite to the first surface, wherein the substrate includes at least one conductive pad; (b) attaching a bonding layer on a redistribution structure; and (c) attaching the redistribution structure on the at least one conductive pad of the substrate by the bonding layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
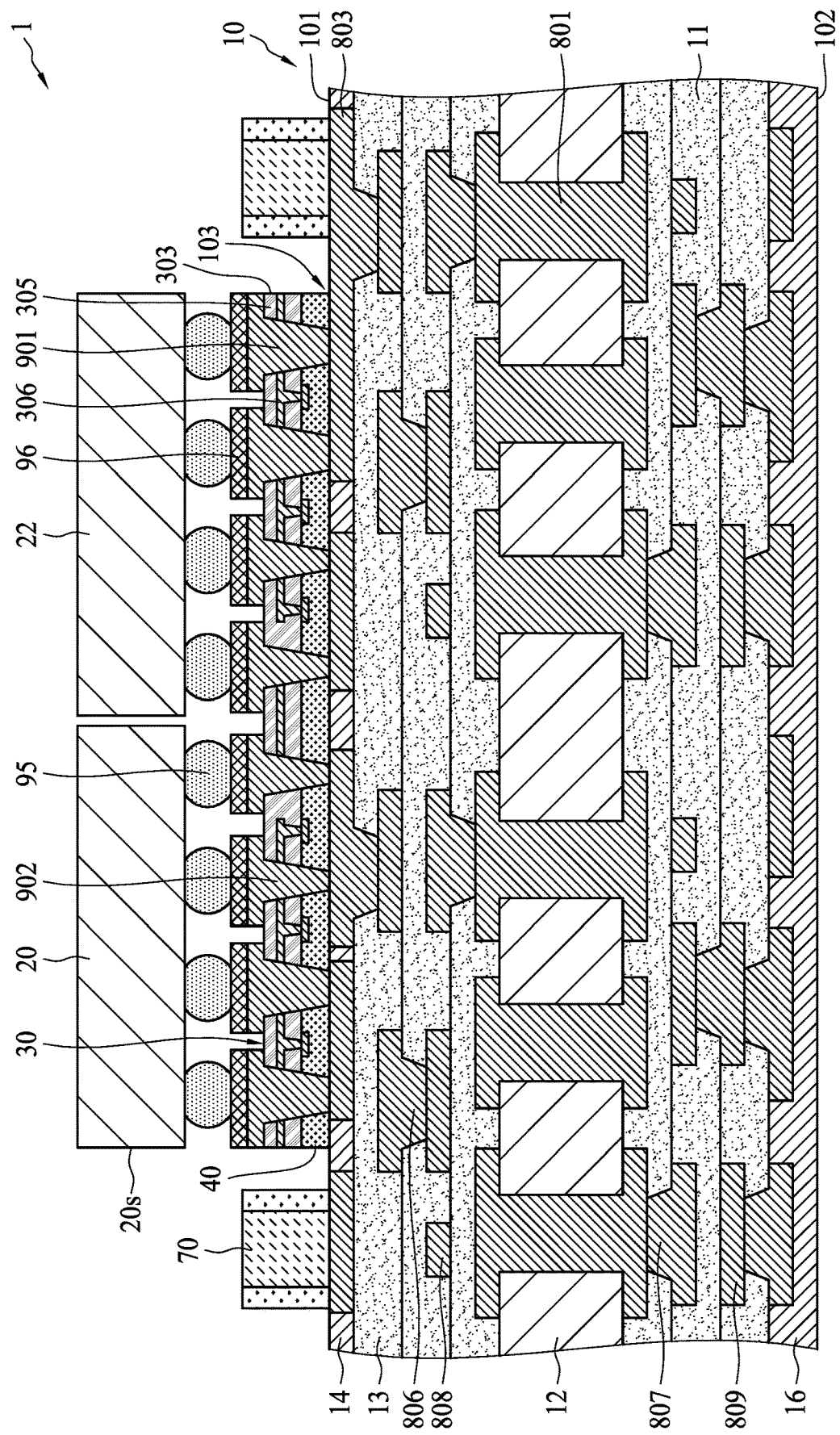
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a new package structure. The package structure includes at least one redistribution structure and at least one electronic component disposed on a first surface of a substrate. At least one semiconductor die is disposed on the at least one redistribution structure and electrically connected to the at least one electronic component through the substrate. The electrical path from the electronic component to the semiconductor die through the substrate may be shortened. The shortened electrical path may reduce the signal loss and improve the electrical performance.

FIG. 1 illustrates a cross-sectional view of a package structure 1 according to some embodiments of the present disclosure. The package structure 1 includes substrate 10, a redistribution structure 30, at least one first conductive via 901, at least one second conductive via 902, at least one electronic component 70, at least one semiconductor die (including, for example, a first semiconductor die 20 and a second semiconductor die 22).

In some embodiments, the substrate 10 includes at least one dielectric layer (including, for example, one first upper dielectric layer 13, one second upper dielectric layer 14, one first lower dielectric layer 11 and one second lower dielectric layer 16) and at least one circuit layer (including, for example, one first upper circuit layer 808, one second upper circuit layer 803 and one lower circuit layer 809 formed of a metal, a metal alloy, or other conductive material) in contact with the dielectric layer (e.g., the one first upper dielectric layer 13 and the first lower dielectric layer 11). In some embodiments, the second upper circuit layer 803 may be conductive pads.

In some embodiments, the substrate 10 may be similar to a core substrate that further includes a core portion 12, and may be in a wafer type, a panel type or a strip type. The substrate 10 may be also referred to as "a stacked structure" or "a low-density conductive structure" or "a low-density stacked structure". The circuit layer (including, for example, the upper circuit layer 808 and the lower circuit layer 809) of the substrate 10 may be also referred to as "a low-density circuit layer". As shown in FIG. 1, the substrate 10 has a first surface 101 (e.g., a top surface) and a second surface 102 (e.g., a bottom surface) opposite to the first surface 101.

In some embodiments, the substrate 10 may include at least one inner via (including, for example, a plurality of interconnection vias 801, a plurality of upper interconnection vias 806 and a plurality of lower interconnection vias 807) formed of a metal, a metal alloy, or other conductive material.

The core portion 12 has a top surface and a bottom surface opposite to the top surface. The first upper circuit layers 808, the second upper circuit layer 803, the first upper dielectric layer 13 and the second upper dielectric layer 14 may be disposed on the top surface of the core portion 12. The second upper circuit layer 803 may include at least one conductive pad. Further, the lower circuit layers 809, the first lower dielectric layer 11 and the second lower dielectric layer 16 may be disposed on the bottom surface of the core portion 12. The interconnection vias 801 may extend through the core portion 12 and electrically connect the first upper circuit layer 808 and the lower circuit layer 809. Some of the upper interconnection vias 806 may be disposed between two first upper circuit layers 808 for electrically connecting the first upper circuit layers 808. Some of the upper interconnection vias 806 may be disposed between the first upper circuit layers 808 and the second upper circuit layer 803 for electrically connecting the first upper circuit layers 808 and the second upper circuit layer 803. In addition, some of the lower interconnection vias 807 may be disposed between two lower circuit layers 809 for electrically connecting the lower circuit layers 809.

In some embodiments, a material of the core portion 12 may include a bismaleimide triazine (BT) resin with a reinforcement material such as glass fiber. The first upper circuit layers 808 may be embedded in the first upper dielectric layers 13. The second upper circuit layer 803 may be disposed on the first upper dielectric layers 13. The second upper dielectric layer 14 may contact the second upper circuit layer 803. Further, the lower circuit layers 809 may be embedded in the first lower dielectric layers 11. The second lower dielectric layer 16 may contact the bottommost lower circuit layers 809. Materials of the first upper dielectric layers 13 and the first lower dielectric layers 11 may be, for example, polypropylene (PP) or ajinomoto build-up film (ABF). In some embodiments, a plurality of fibers (e.g., glass fibers) may be embedded in the first upper dielectric layers 13 and the first lower dielectric layers 11 to improve the material strength of the first upper dielectric layers 13 and the first lower dielectric layers 11. In some embodiments, the second upper dielectric layer 14 and the second lower dielectric layer 16 may be solder mask layers.

The redistribution structure 30 is disposed on the first surface 101 of the substrate 10. The redistribution structure 30 is attached to the substrate 10 through the bonding layer 40. The bonding layer 40 is interposed between the redistribution structure 30 and the substrate 10 to bond the redistribution structure 30 and the substrate 10 together. The bonding layer 40 may be cured from an adhesive material. The bonding layer 40 covers at least one conductive pad of the second upper circuit layer 803 of the substrate 10. The redistribution structure 30 is electrically connected to the substrate 10 through at least one first conductive via 901 and/or at least one second conductive via 902. The first conductive via 901 and the second conductive via 902 extend through the bonding layer 40 and a portion of the redistribution structure 30.

The redistribution structure 30 includes at least one dielectric layer 305 and at least one circuit layer 306 (formed of a metal, a metal alloy, or other conductive material) in contact with or embedded in the dielectric layer 305. In some embodiments, the redistribution structure 30 may be similar to a coreless substrate, and may be in a wafer type, a panel type or a strip type. The redistribution structure 30 may be also referred to as "a stacked structure" or "a high-density conductive structure" or "a high-density stacked structure". The circuit layer (including, for example, the circuit layer 306) of the redistribution structure 30 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, a trace or a pad) in a unit area of the high-density circuit layer is greater than the count of the circuit line in an equal unit area of the low-density circuit layer, such as about 1.2 times or greater, about 1.5 times or greater, or about 2 times or greater. Alternatively, or in combination, a line width/line space (L/S) of the high-density circuit layer is less than a L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure.

In some embodiments, a portion of the first surface 101 of the substrate 10 is exposed from the redistribution structure 30 from a top view. In some embodiments, a lateral side surface 303 of the redistribution structure 30 is recessed from a lateral side surface of the substrate 10 to form a step structure 103 for at least one electronic component 70 to be disposed. In some embodiments, the lateral side surface 303 of the redistribution structure 30 may substantially contact a lateral side surface of the electronic component 70. In some embodiments, the lateral side surface 303 of the redistribution structure 30 is substantially coplanar with a lateral side surface 20s of the first semiconductor die 20 or the second semiconductor die 22. The redistribution structure 30 electrically connects the first semiconductor die 20 and the second semiconductor die 22 to the substrate 10.

In some embodiments, the at least one first conductive via 901 and the at least one second conductive via 902 extend through the redistribution structure 30 (including the dielectric layer 305 and the circuit layer 306). The first conductive via 901 and the second conductive via 902 are formed of a metal, a metal alloy, or other conductive material. In some embodiments, the diameter of the first conductive via 901 is about 60 μm (micrometers) and the diameter of the second conductive via 902 is less than 30 μm. A diameter of the first conductive via 901 is greater than a diameter of the second conductive via 902. The first conductive via 901 is nearer the electronic components 70 than the second conductive via 902.

In comparing with the second conductive via 902, the relatively greater diameter of the first conductive via 901 may accomplish a transmission of a large amount of signal. In addition, since the conductive via 901 is nearer the electronic component 70, the signal transmission path between the semiconductor die (e.g., the first semiconductor die 20 and the second semiconductor die) and the electronic component 70 through the conductive via 901 is shortened, which may reduce signal loss. Thus, the signal transmission path through the first conductive via 901 has less signal loss than through the second conductive via 902.

The electronic components 70 are disposed on the surface 101 of the substrate 10. The electronic component 70 may be a passive component. The electronic components 70 and the redistribution structure 30 are disposed side by side. The electronic components 70 may contact and may be electrically connected to the conductive pad of the second upper circuit layer 803 of the substrate 10. At least one of the electronic components 70 may be electrically connected to the first semiconductor die 20 and the second semiconductor die 22 through the second upper circuit layer 803 and the first conductive vias 901.

The first semiconductor die 20 and the second semiconductor die 22 are disposed on the redistribution structure 30. The first semiconductor die 20 and the second semiconductor die 22 are electrically connected to the at least one electronic component 70 through the substrate 10. In some embodiments, the first semiconductor die 20 and/or the second semiconductor die 22 may be electrically connected to the electronic component(s) 70 through the conductive bumps 95, the surface finish layers 96, the first conductive via 901 and the second upper circuit layer 803 of the substrate 10. The conductive bumps 95 may include solder material.

Figure 2A:
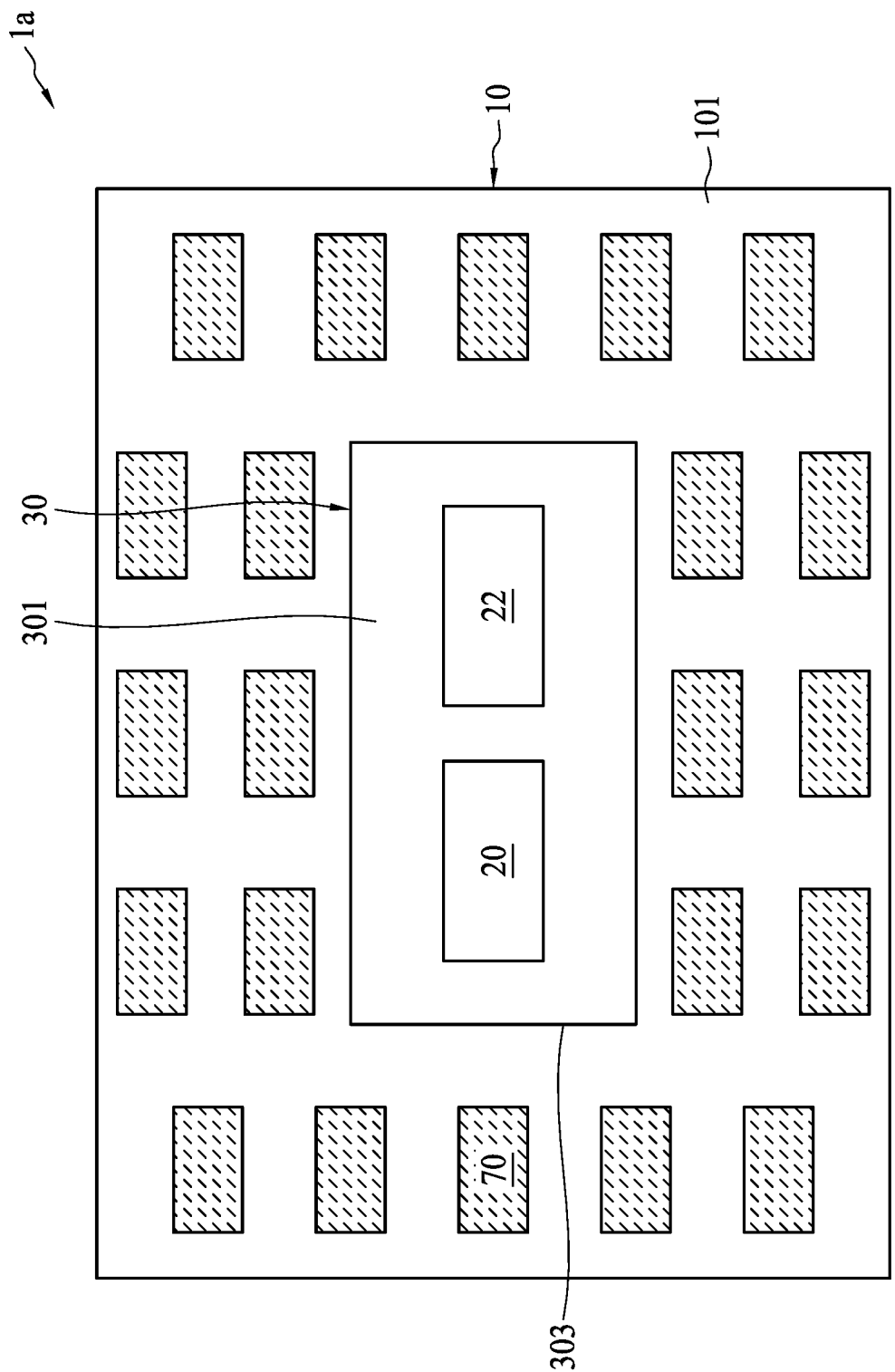
FIG. 2A illustrates a top view of an example of a package structure according to some embodiments of the present disclosure.

FIG. 2A illustrates a top view of an example of a package structure 1a according to some embodiments of the present disclosure. The redistribution structure 30 is disposed on the first surface 101 of the substrate 10. The semiconductor dice 20 and 22 are disposed on the redistribution structure 30. An area of the redistribution structure 30 is smaller than an area of the substrate 10 from a top view. The plurality of electronic components 70 are disposed on the first surface 101 of the substrate 10 and electrically connected to the substrate 10. In some embodiments, a projection of the redistribution structure 30 falls on the substrate 10. The projection of the redistribution structure 30 falls within the area of the surface 101 of the substrate 10. The plurality of electronic components 70 surround the redistribution structure 30. In some embodiments, a ratio of an area of the redistribution structure 30 to an area of the substrate 10 is in a range of one third to one half.

Figure 2B:
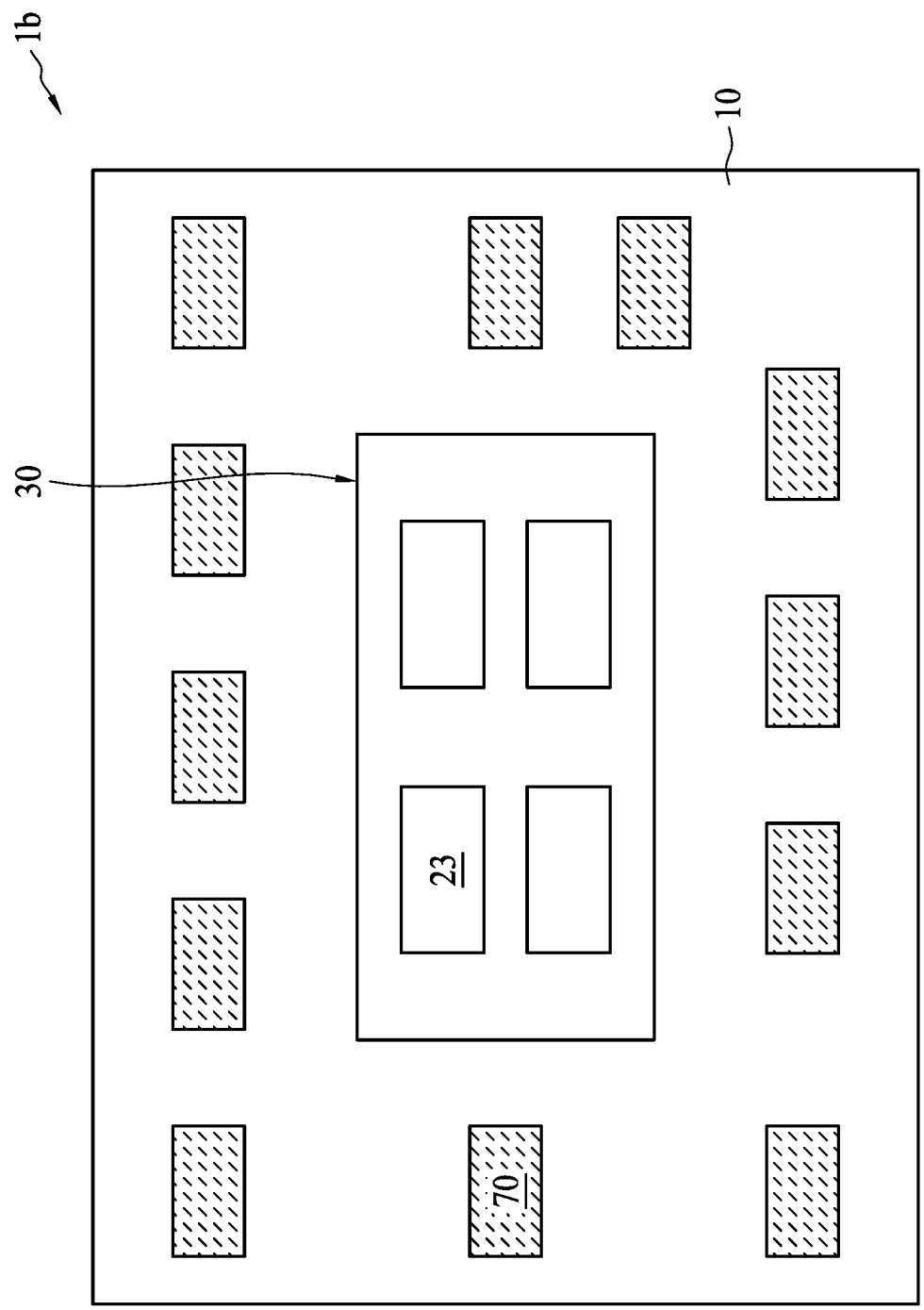
FIG. 2B illustrates a top view of another example of a package structure according to some embodiments of the present disclosure.

FIG. 2B illustrates a top view of another example of a package structure 1b according to some embodiments of the present disclosure. There are four semiconductor dice 23 disposed on the redistribution structure 30. In some embodiments, the number of the semiconductor dice may not be limited.

Figure 2C:
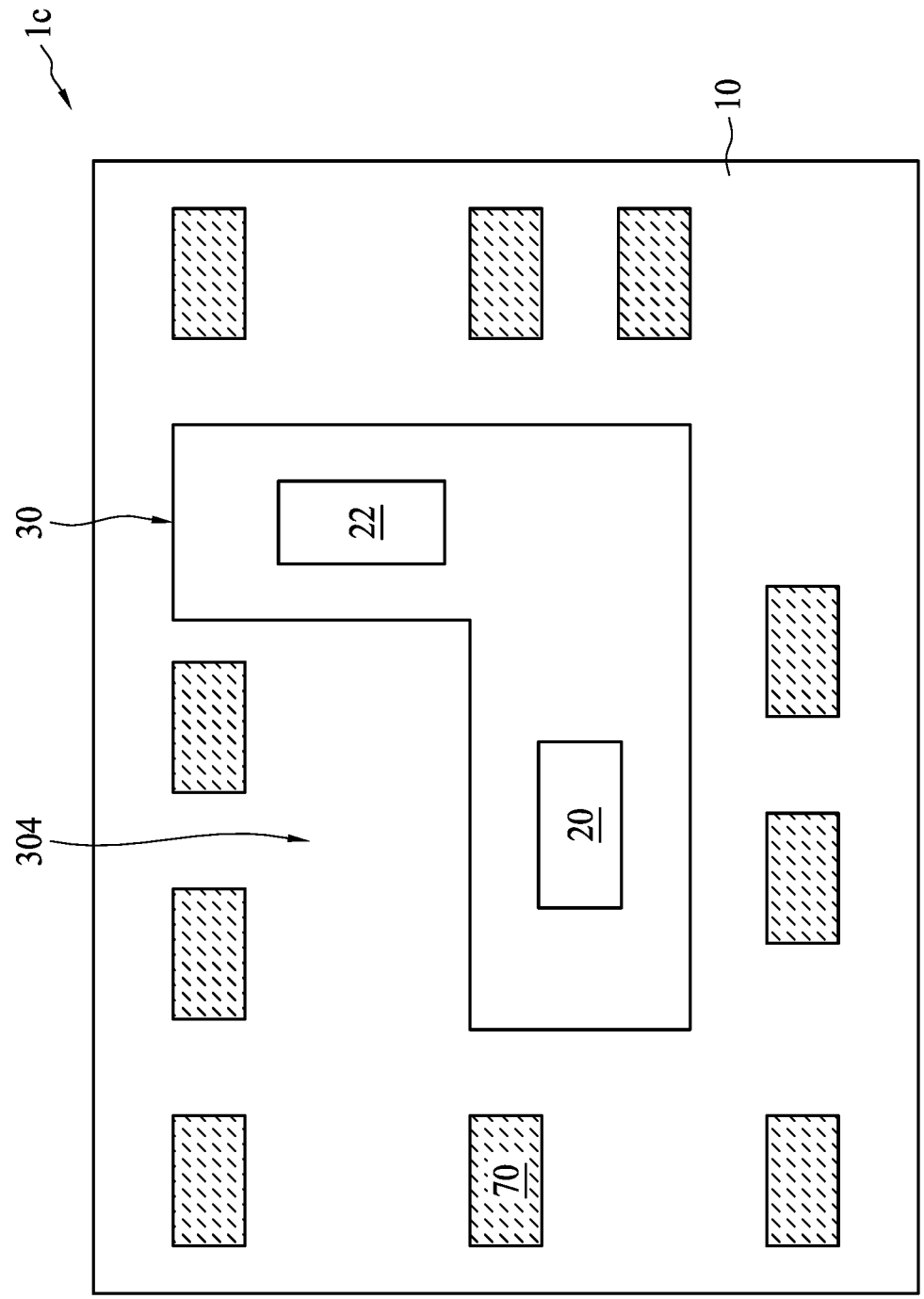
FIG. 2C illustrates a top view of another example of a package structure according to some embodiments of the present disclosure.

FIG. 2C illustrates a top view of another example of a package structure 1c according to some embodiments of the present disclosure. The redistribution structure 30 may define an accommodating space 304 for accommodating a plurality of electronic components 70 from a top view. In some embodiments, the accommodating space 304 may accommodate at least one electronic component 70 from a top view. As shown in FIG. 2C, the redistribution structure 30 may be in an L-shape.

Figure 3:
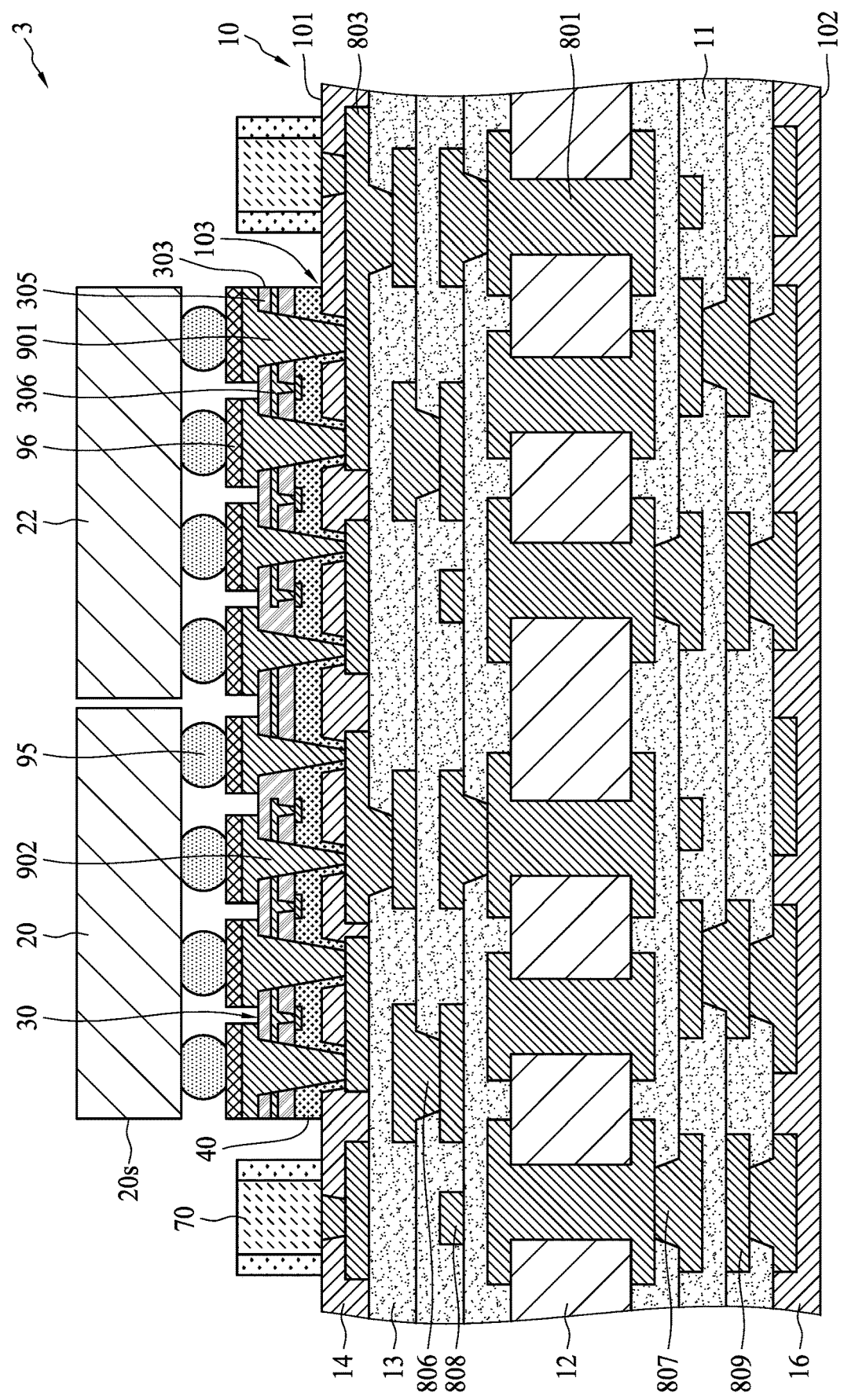
FIG. 3 illustrates a cross-sectional view of a package structure according to some embodiments of the present disclosure.

FIG. 3 illustrates a cross-sectional view of a package structure 3 according to some embodiments of the present disclosure. The package structure 3 is similar to the package structure 1 shown in FIG. 1, except that the second upper dielectric layer 14 covers the second upper circuit layer 803. The first conductive via 901 and the second conductive via 902 are electrically connected to the second upper circuit layer 803 and extend through the bonding layer 40 and the second upper dielectric layer 14. In some embodiments, the second upper dielectric layer 14 may define a plurality of openings to expose portions of the second upper circuit layer 803. A portion of the bonding layer 40 may extend into the openings of the second upper dielectric layer 14. The first conductive via 901 and the second conductive via 902 may extend through the openings of the second upper dielectric layer 14. A portion of the bonding layer 40 may surround a portion of the first conductive via 901 and the second conductive via 902 in the openings of the second upper dielectric layer 14.

Figure 4:
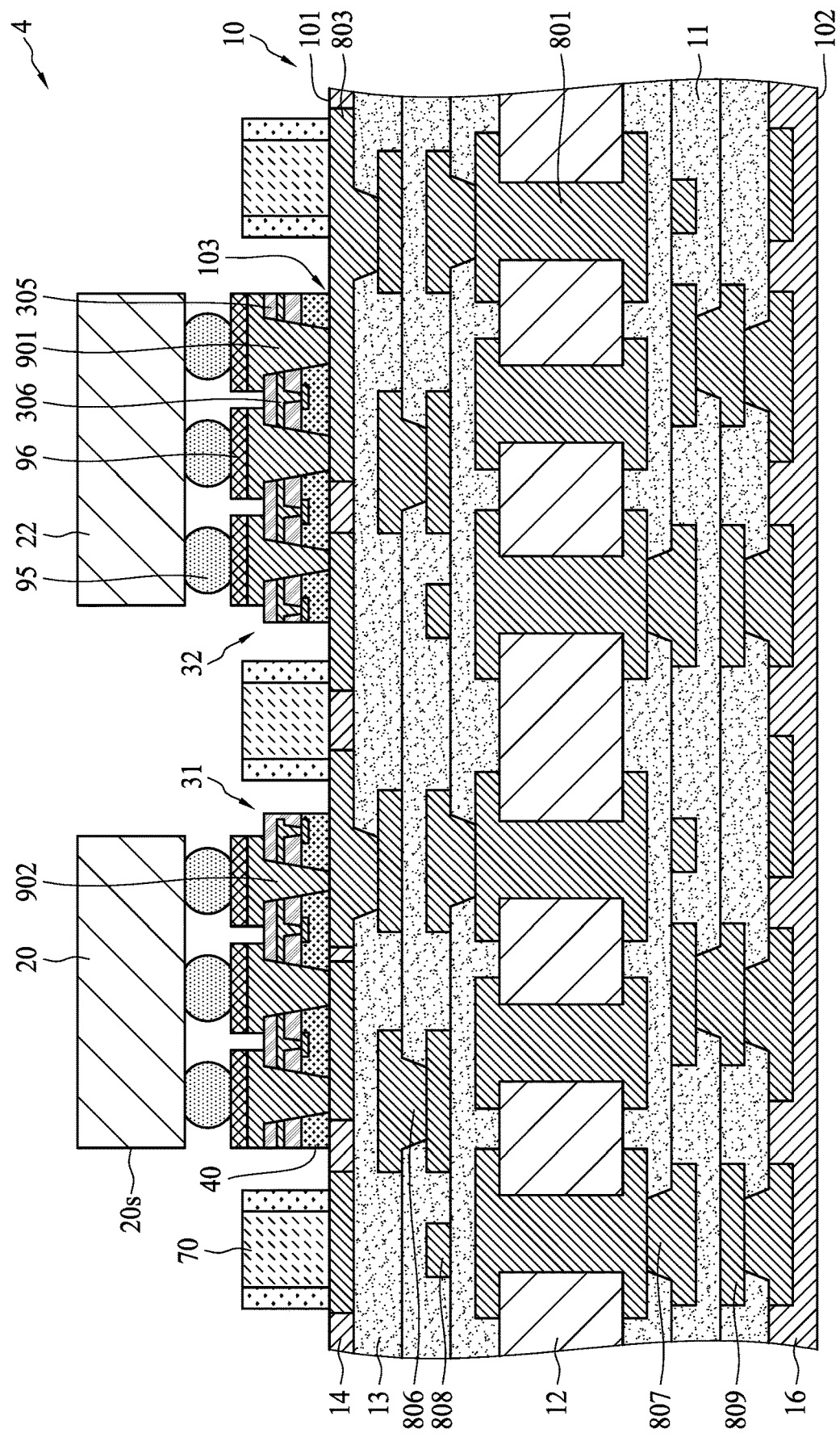
FIG. 4 illustrates a cross-sectional view of a package structure according to some embodiments of the present disclosure.

FIG. 4 illustrates a cross-sectional view of a package structure 4 according to some embodiments of the present disclosure. The package structure 4 is similar to the package structure 1 shown in FIG. 1, except that there are two redistribution structures (including, for example, a first redistribution structure 31 and a second redistribution structure 32) disposed on the substrate 10. The two redistribution structures (e.g., the first redistribution structure 31 and the second redistribution structure 32) are separated by the electronic component 70. The electronic component 70 is disposed between the two redistribution structures 30. The first semiconductor die 20 is disposed on the first redistribution structure 31, and the second semiconductor die 22 is disposed on the second redistribution structures 32. In some embodiments, the electronic component 70 is disposed between the first redistribution structure 31 and the second redistribution structure 32. Thus, the electronic component 70 is disposed between the first semiconductor die 20 and the second semiconductor die 22.

Figure 5:
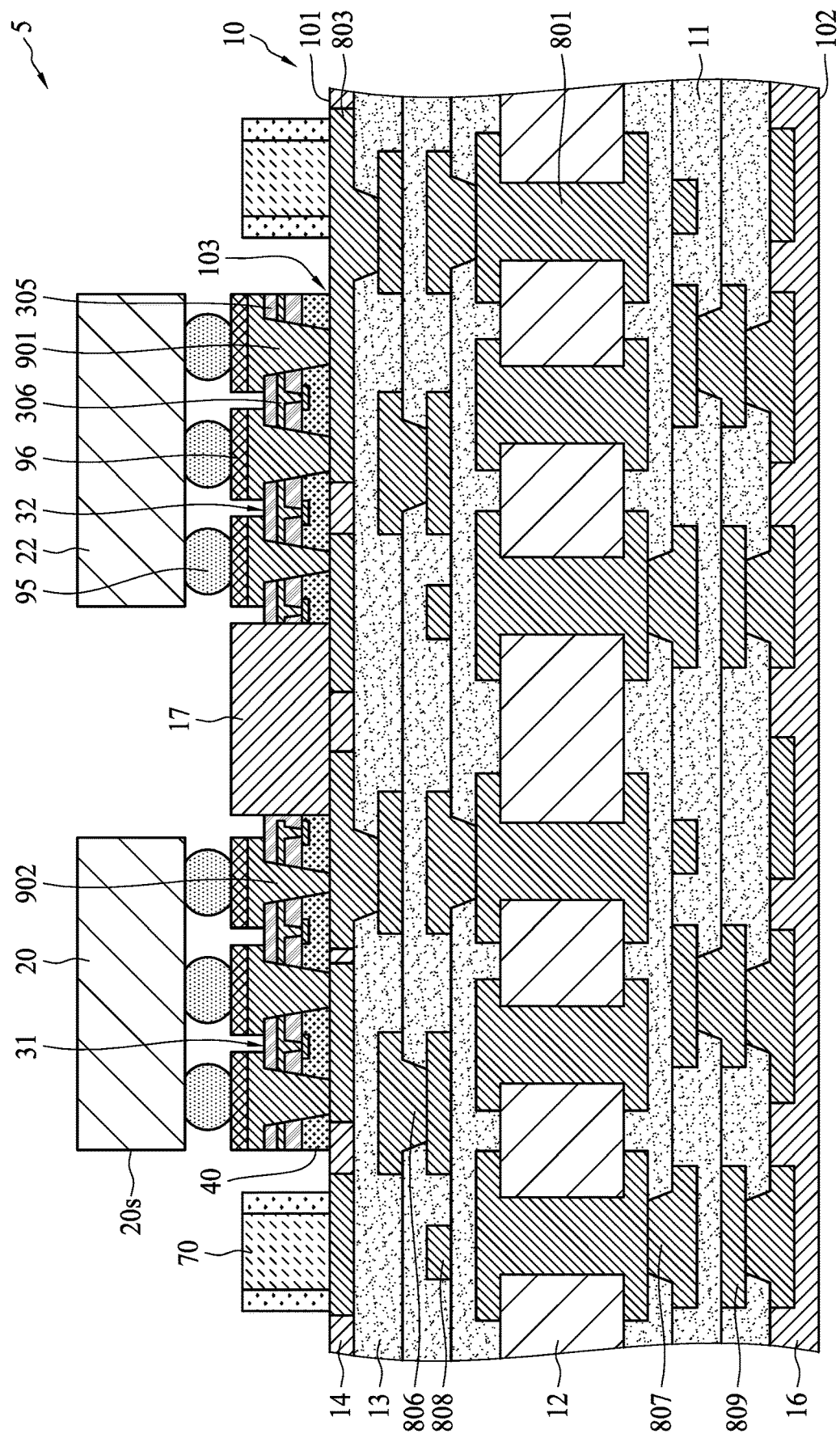
FIG. 5 illustrates a cross-sectional view of a package structure according to some embodiments of the present disclosure.

FIG. 5 illustrates a cross-sectional view of a package structure 5 according to some embodiments of the present disclosure. The package structure 5 is similar to the package structure 4 shown in FIG. 4, except that the electronic component 70 disposed between the first redistribution structure 31 and the second redistribution structure 32 is replaced by a dielectric layer 17. The dielectric layer 17 is disposed on the substrate 10. The lateral surfaces of the two redistribution structures (e.g., the first redistribution structure 31 and the second redistribution structure 32) contact the dielectric layer 17. The dielectric layer 17 may cover a lateral surface of the first redistribution structure 31 and a lateral surface of the second redistribution structure 32. In some embodiments, the dielectric layer 17 completely encapsulates the two redistribution structures (e.g., the first redistribution structure 31 and the second redistribution structure 32) (not shown).

Figure 6:
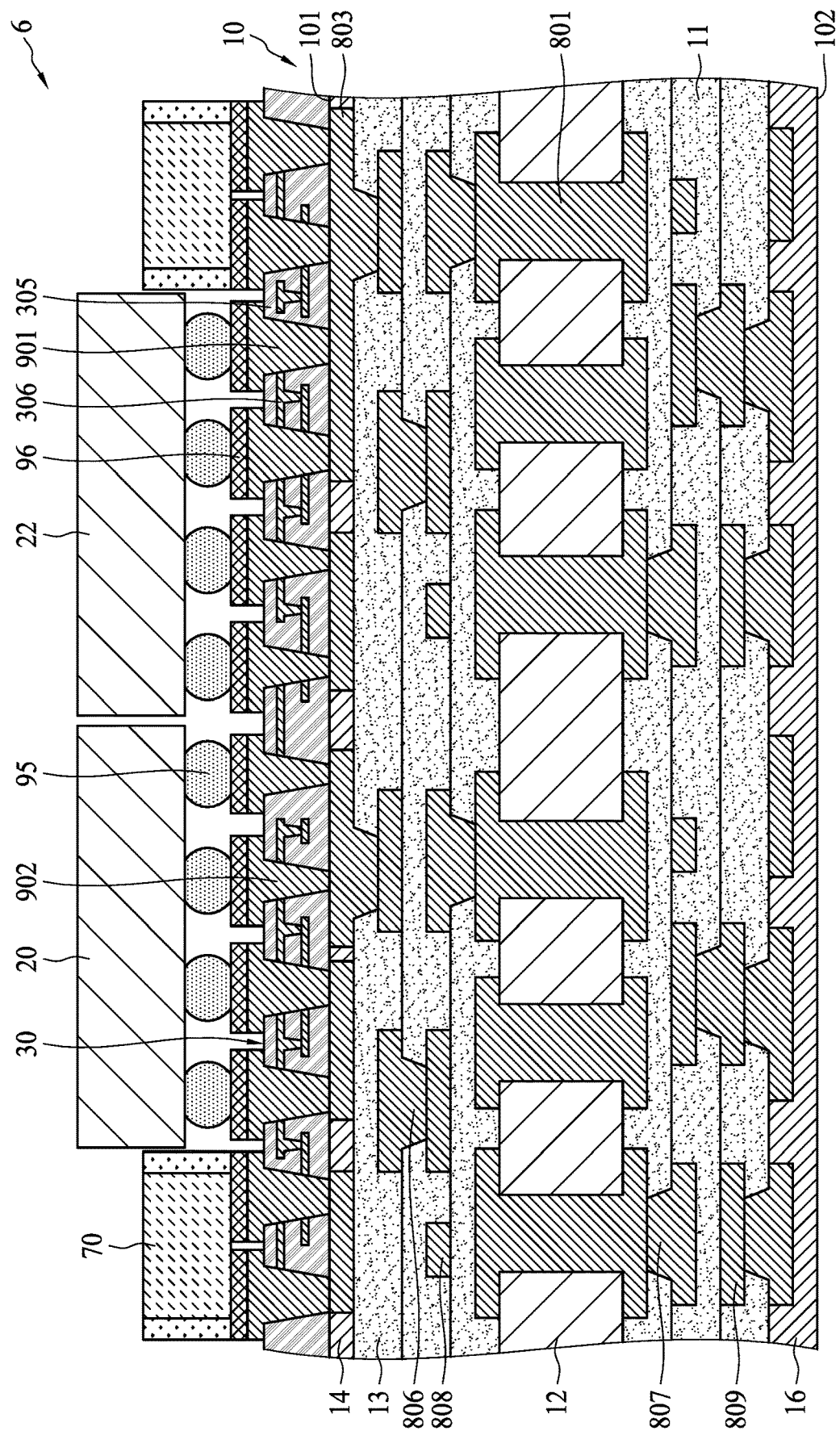
FIG. 6 illustrates a cross-sectional view of a package structure according to some embodiments of the present disclosure.

FIG. 6 illustrates a cross-sectional view of a package structure 6 according to some embodiments of the present disclosure. The package structure 6 is a comparative embodiment. The package structure 6 is similar to the package structure 1 shown in FIG. 1, except that the electronic components 70 are disposed on the redistribution structure 30. The electronic components 70 contact the surface finish layer 96. The electronic components 70 are electrically connected to the substrate 10 through the surface finish layer 96, the conductive via and the second upper circuit layer 803. The longer signal transmission path from the semiconductor dice 20, 22 to the electronic components 70 may result in greater signal loss.

FIGS. 7A, 7B, 7C and 7D illustrate a method for manufacturing a package structure according to some embodiments of the present disclosure. In some embodiments, the method is for manufacturing the package structure 1 shown in FIG. 1.

Figure 7A:
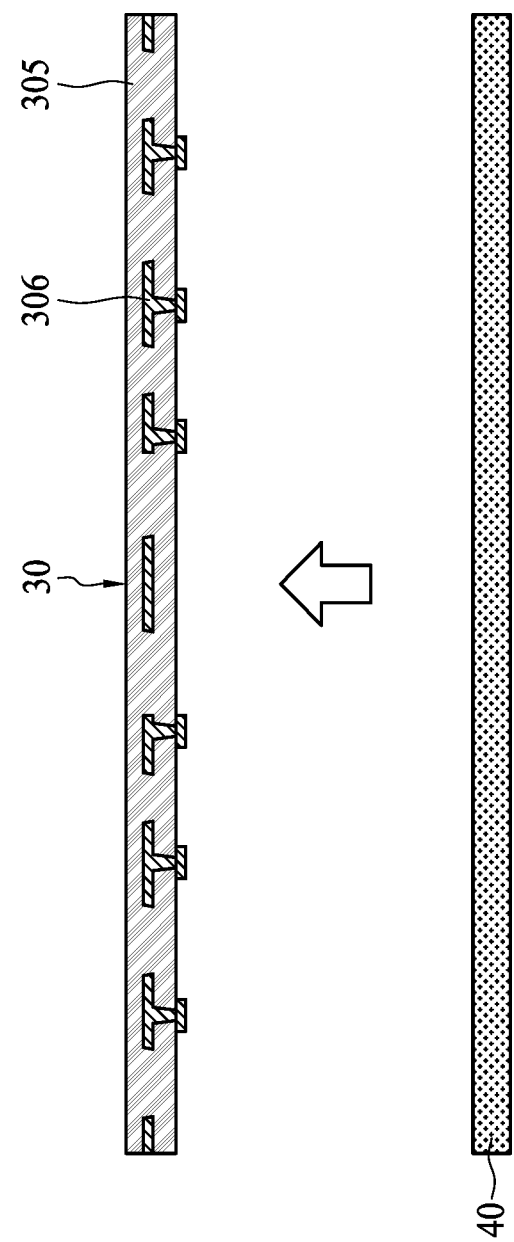
FIG. 7A illustrates one or more stages of an example of a method for manufacturing a package structure according to some embodiments of the present disclosure.

Referring to FIG. 7A, a redistribution structure 30 is provided. The redistribution structure 30 of FIG. 7A may be similar to the redistribution structure 30 of FIG. 1. The redistribution structure 30 includes at least one dielectric layer 305 and at least one circuit layer 306. Then, a bonding layer 40 is provided. The bonding layer 40 may be an adhesive layer. The bonding layer 40 is attached on the bottom surface of the redistribution structure 30. The bonding layer 40 covers a portion of the circuit layer 306.

Figure 7B:
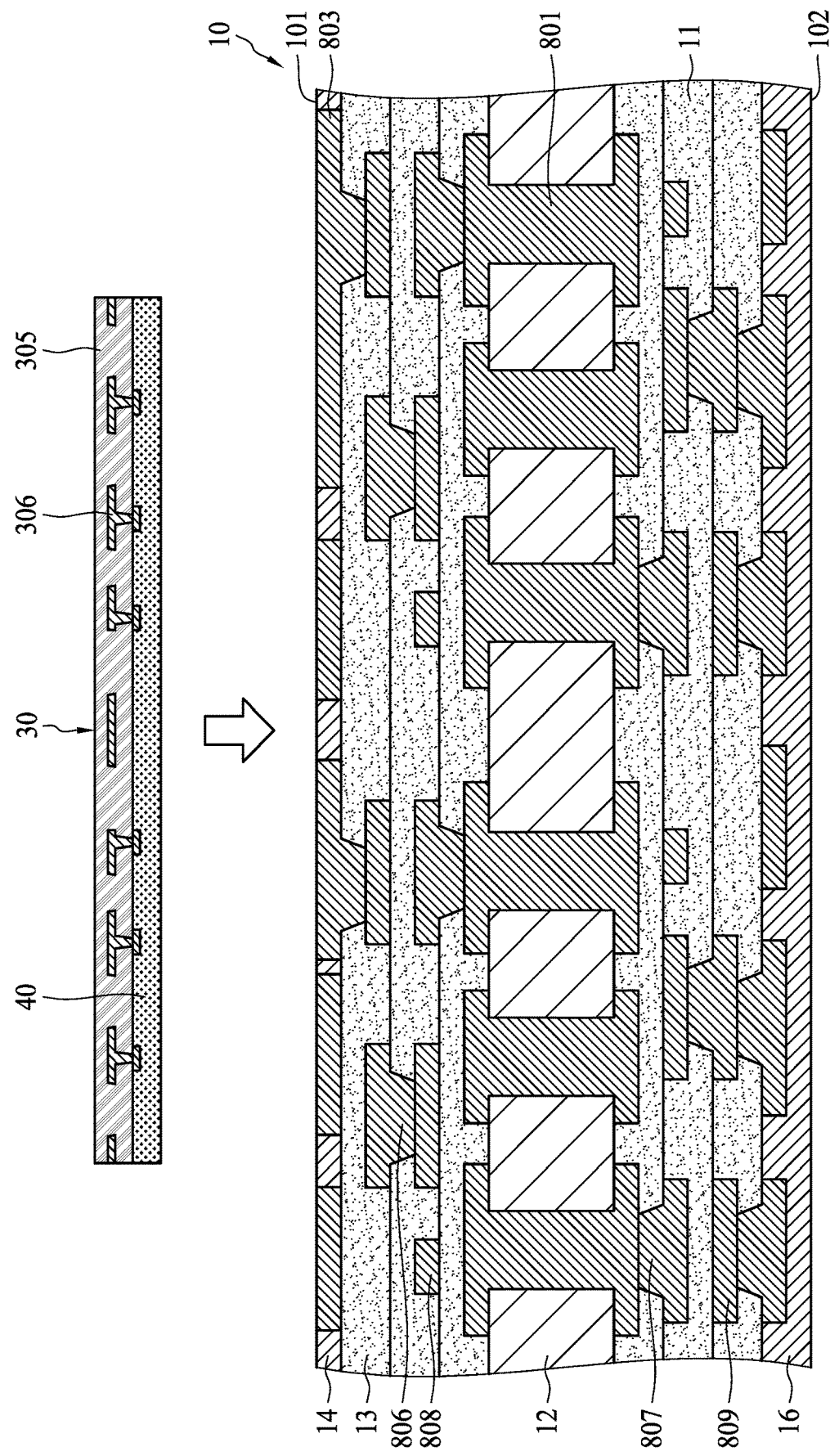
FIG. 7B illustrates one or more stages of an example of a method for manufacturing a package structure according to some embodiments of the present disclosure.

Referring to FIG. 7B, a substrate 10 is provided. The substrate 10 of FIG. 7B may be similar to the substrate 10 of FIG. 1. The substrate 10 includes at least one dielectric layer (including, for example, one first upper dielectric layer 13, one second upper dielectric layer 14, one first lower dielectric layer 11 and one second lower dielectric layer 16) and at least one circuit layer (including, for example, one first upper circuit layer 808, one second upper circuit layer 803 and one lower circuit layer 809) The second upper circuit layer 803 may include at least one conductive pad. In addition, the substrate 10 has a first surface 101 (e.g., a top surface) and a second surface 102 (e.g., a bottom surface) opposite to the first surface 101.

In some embodiments, the bonding layer 40 may be bonded on the substrate 10 firstly. Next, the redistribution structure 30 is attached on the bonding layer 40. Since an upper surface of the second upper circuit layer 803 may have slight height variation, the upper surface of the bonding layer 40 (the surface being contact with the redistribution structure 30) may be not non-planar, resulting in the risk of the void residue after bonding the redistribution structure 30. To address such concern, in a comparative embodiment, the bonding layer 40 may be thickened and the total thickness of the package structure 1 is increased. The size of the vias 901 formed subsequently may also be increased and the number of the I/O is reduced. Therefore, in the embodiment illustrated in FIG. 7B, attaching the bonding layer 40 to the redistribution structure 30 firstly is preferred, since the bottom surface of the redistribution structure 30 (including the surface of the dielectric layer and the pads of the redistribution structure 30) has a preferable overall flatness. After attaching the bonding layer 40 to the redistribution structure 30, the redistribution structure 30 and the bonding layer 40 are together bonded to the substrate 10. Since the redistribution structure 30 is a unit element, the pressure of bonding the redistribution structure 30 to the second upper circuit layer 803 is greater than the pressure of disposing the bonding layer 40 to the second upper circuit layer 803, so that the second upper circuit layer 803 is easily embedded in the bonding layer 40 and the void between the second upper circuit layer 803 and the bonding layer 40 may be relatively avoided. This arrangement may prevent the void in the bonding layer 40.

Figure 7C:
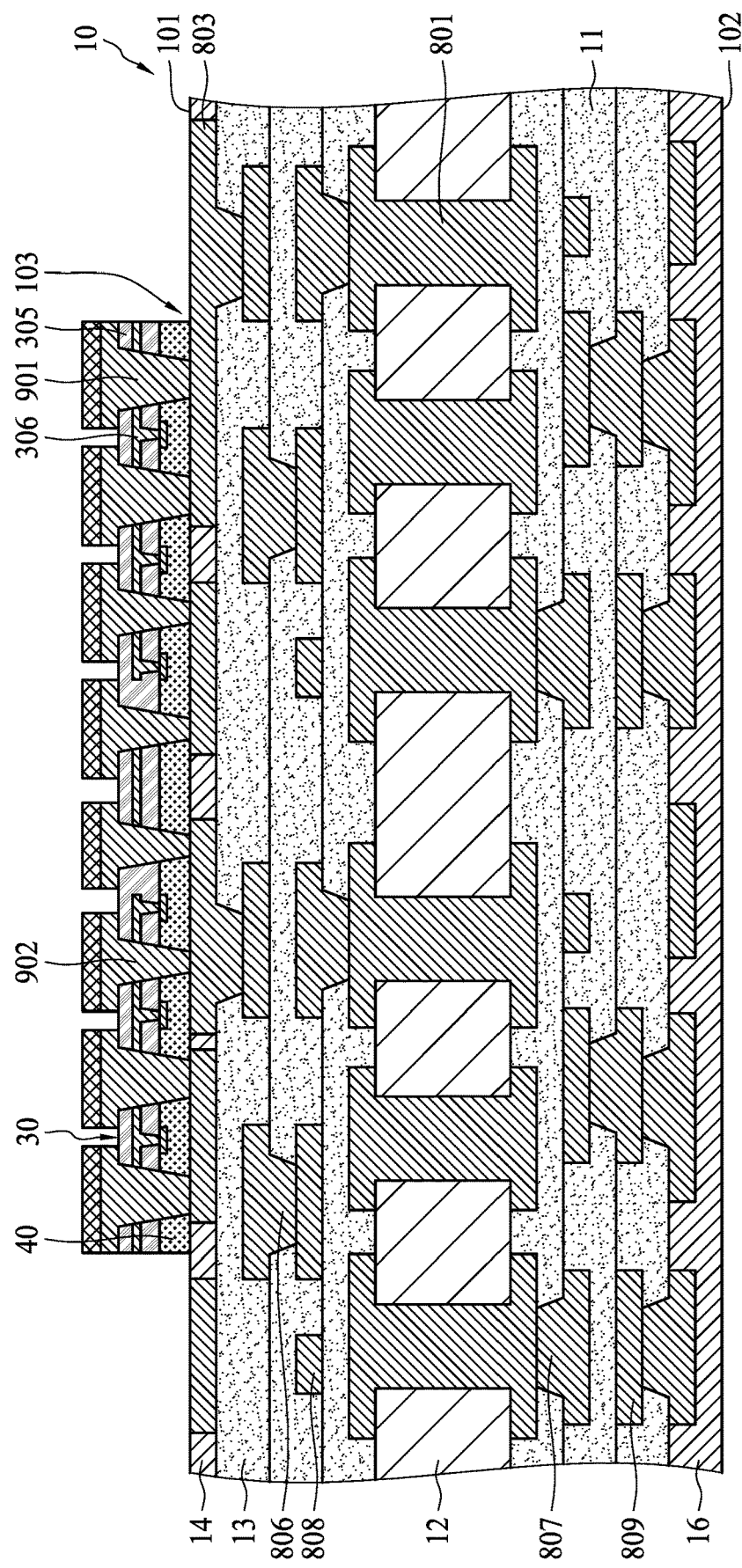
FIG. 7C illustrates one or more stages of an example of a method for manufacturing a package structure according to some embodiments of the present disclosure.

Referring to FIG. 7C, the redistribution structure 30 is attached to the substrate 10 through the bonding layer 40. The redistribution structure 30 is attached on the conductive pad of the second upper circuit layer 803 of the substrate 10 by the bonding layer 40. The bonding layer 40 covers the conductive pad of the second upper circuit layer 803. In some embodiments, a portion of the surface 101 of the substrate 10 is exposed from the redistribution structure 30 from a top view. Then, a plurality of first conductive vias 901 and a plurality of second conductive vias 902 are formed to extend through the redistribution structure 30 and the bonding layer 40. The first conductive vias 901 and the second conductive vias 902 contact the conductive pad of the second upper circuit layer 803. Then, the surface finish layers 96 are formed on the first conductive vias 901 and the second conductive vias 902.

Figure 7D:
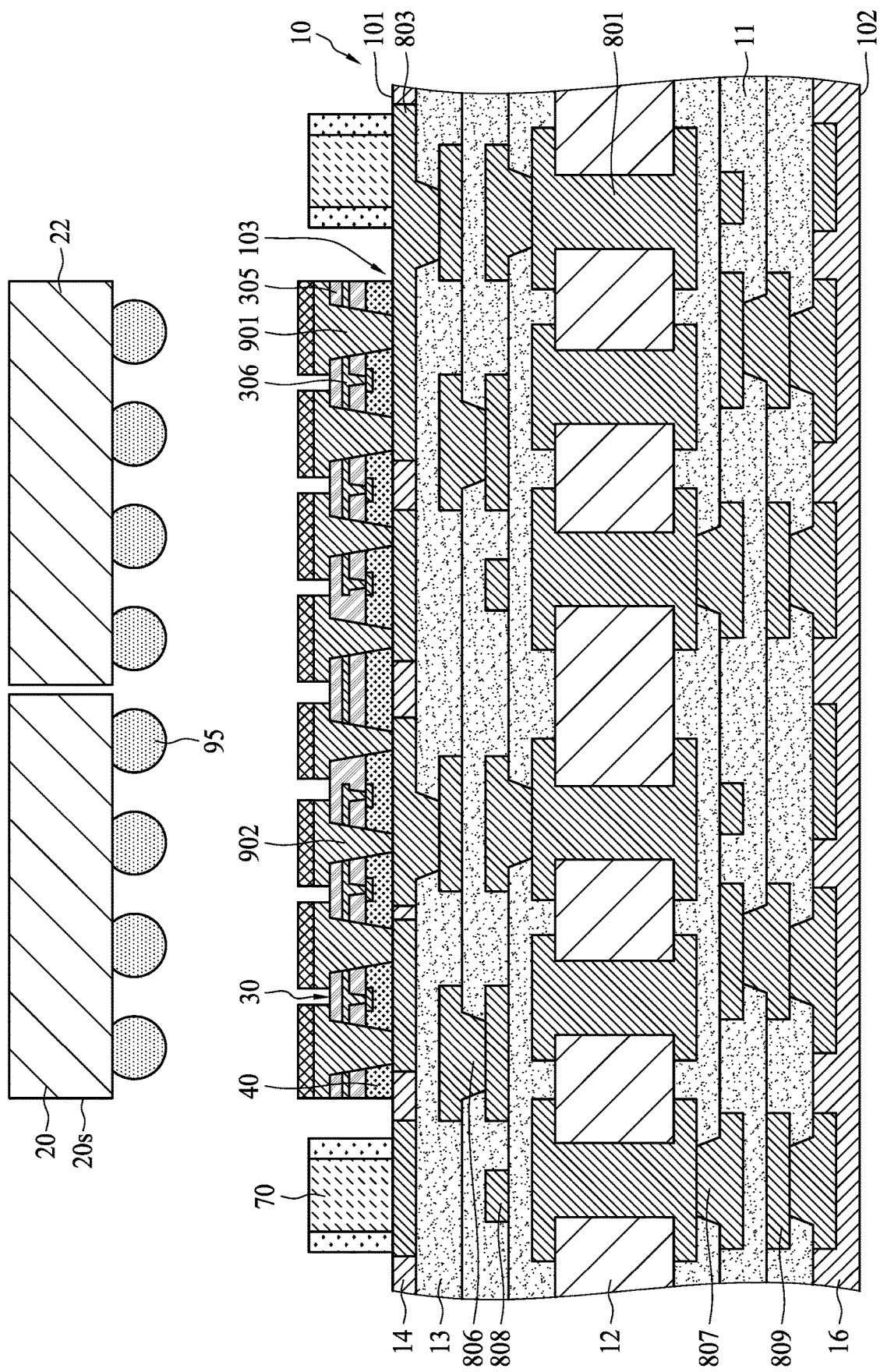
FIG. 7D illustrates one or more stages of an example of a method for manufacturing a package structure according to some embodiments of the present disclosure.

Referring to FIG. 7D, a plurality of electronic components 70 are attached on the surface 101 of the substrate 10 to electrically connect the second upper circuit layer 803 of the substrate 10. Then, two semiconductor dice (e.g., a first semiconductor die 20 and a second semiconductor die 22) are provided and attached to the surface finish layers 96 by the conductive bumps 95. Thus, the semiconductor dice (e.g., the first semiconductor die 20 and the second semiconductor die 22) are electrically connected to the first conductive vias 901 and the second conductive vias 902. Therefore, the package structure 1 of FIG. 1 is obtained.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
    a low-density conductive structure;
    a high-density conductive structure disposed over the low-density conductive structure;
    a bonding layer bonding the high-density conductive structure and the low-density conductive structure together;
    a first tapered through via extending through the high-density conductive structure and the bonding layer to electrically connect to the low-density conductive structure, wherein the first tapered through via includes a first upper portion, and a bottom surface of the first upper portion directly contacts a top surface of the high-density conductive structure;
    a second tapered through via extending through the high-density conductive structure and the bonding layer to electrically connect to the low-density conductive structure, wherein the second tapered through via includes a second upper portion, and a bottom surface of the second upper portion directly contacts the top surface of the high-density conductive structure; and
    a surface finish layer completely covering a top surface of the first tapered through via and wherein a lateral width of the surface finish layer is greater than a lateral width of an opening accommodating the first tapered through via,
    wherein in a cross-sectional view, the first tapered through via has a first width, the second tapered through via has a second width, and the first width is different from the second width, wherein an inclined side surface of the bonding layer is continuous with an inclined side surface of the high-density conductive structure, and a portion of a circuit layer of the high-density conductive structure is exposed from the inclined side surface of the high-density conductive structure.

2. The package structure according to claim 1, further comprising a semiconductor die disposed over the high-density conductive structure and electrically connected to the low-density conductive structure through the surface finish layer.

3. The package structure according to claim 1, further comprising a semiconductor die attached to the surface finish layer by a plurality of conductive bumps, wherein a lateral width of one of the plurality of conductive bumps is less than a lateral width of the surface finish layer.

4. The package structure according to claim 1, wherein the surface finish layer further comprises a first surface finish layer on the first tapered through via and a second surface finish layer on the second tapered through via, and wherein an elevation of the first surface finish layer is substantially aligned with an elevation of the second surface finish layer.

5. The package structure according to claim 1, wherein a side surface of the surface finish layer is substantially aligned with a side surface of the bonding layer and a side surface of the high-density conductive structure.

6. The package structure according to claim 1, wherein the first tapered through via contacts a conductive portion of the circuit layer, and an inclined side surface of the conductive portion of the circuit layer is continuous with the inclined surface of the high-density conductive structure.

7. A package structure, comprising:
   a substrate comprising a circuit layer;
   a first redistribution structure disposed over the substrate;
   a second redistribution structure disposed over the substrate;
   a first tapered through via extending through the first redistribution structure and electrically connecting the first redistribution structure and the circuit layer of the substrate;
   a second tapered through via extending through the second redistribution structure and electrically connecting the second redistribution structure and the circuit layer of the substrate;
   a surface finish layer completely covering a top surface of the first tapered through via;
   a semiconductor die disposed over the first redistribution structure and electrically connected to the substrate through the surface finish layers, and wherein a side surface of the semiconductor die is aligned with a side surface of the surface finish layer; and
   a dielectric layer covering a lateral surface of the first redistribution structure and a lateral surface of the second redistribution structure, and wherein an elevation of a top surface of the dielectric layer is aligned with a top surface of the surface finish layer;
   wherein a width of the first tapered through via is different from a width of the second tapered through via.

8. The package structure according to claim 7, wherein the dielectric layer contacts an exposed portion of a circuit layer of the first redistribution structure.

9. The package structure according to claim 7, further comprising:
   a first bonding layer bonding the first redistribution structure and the substrate;
   a second bonding layer bonding the second redistribution structure and the substrate, wherein a first outermost side surface of the dielectric layer is substantially coplanar with a side surface of the first bonding layer, and a second outermost side surface of the dielectric layer is substantially coplanar with a side surface of the second bonding layer.

10. The package structure according to claim 9, further comprising:
    a first notch defined by the first outermost side surface of the dielectric layer, a top surface of the first redistribution structure, and a lateral surface of a pad portion of the first redistribution structure; and
    a second notch defined by the second outermost side surface of the dielectric layer, a top surface of the second redistribution structure, and a lateral surface of a pad portion of the second redistribution structure.

11. The package structure according to claim 7, wherein the first redistribution structure includes a first portion having a lateral surface facing the second redistribution structure, and wherein a vertical projection of the first portion is disposed outside a vertical projection of a first electronic component, a width of the entire first portion is less than a width of a gap between the first redistribution structure and the second redistribution structure.

12. The package structure according to claim 11, wherein the width of the entire first portion is less than a width of the first tapered through via.

13. The package structure according to claim 12, further comprising a surface finish layer completely covering a top surface of the first tapered through via, wherein the width of the entire first portion is less than a width of a solder disposed on the surface finish layer.

14. The package structure according to claim 11, further comprising;
    a bonding layer bonding the first redistribution structure and the substrate; and
    a dielectric layer contacting the first redistribution structure and the second redistribution structure, wherein the dielectric layer is disposed between the first electrical component and the second electrical component, and wherein a lower portion of a side surface of the dielectric layer contacts a side surface of the bonding layer, a middle portion of the side surface of the dielectric layer contacts a side surface of the first redistribution structure, and an upper portion of the side surface of the dielectric layer is exposed to air.

15. The package structure according to claim 14, wherein a first vertical length of the upper portion of the side surface of the dielectric layer is less than a sum of a second vertical length of the middle portion and a third vertical length of the lower portion of the side surface of the dielectric layer.

16. A package structure, comprising:
    a low-density conductive structure;
    a high-density conductive structure disposed over the low-density conductive structure;
    a bonding layer bonding the high-density conductive structure and the low-density conductive structure together, wherein an inclined side surface of the bonding layer is continuous with an inclined side surface of the high-density conductive structure, and a portion of a circuit layer of the high-density conductive structure is exposed from the inclined side surface of the high-density conductive structure;
    a first tapered through via extending through the high-density conductive structure and the bonding layer to electrically connect to the low-density conductive structure, wherein the first tapered through via includes a first upper portion, and a bottom surface of the first upper portion directly contacts a top surface of the high-density conductive structure; and
    a second tapered through via extending through the high-density conductive structure and the bonding layer to electrically connect to the low-density conductive structure, wherein the second tapered through via includes a second upper portion, and a bottom surface of the second upper portion directly contacts the top surface of the high-density conductive structure;
    wherein in a cross-sectional view, the first tapered through via has a first width, the second tapered through via has a second width, and the first width is different from the second width.

* * * * *